US010068662B2

(12) United States Patent
Oya

(10) Patent No.: US 10,068,662 B2
(45) Date of Patent: Sep. 4, 2018

(54) SEMICONDUCTOR DEVICE INCLUDING A ROLL CALL CIRCUIT FOR OUTPUTTING ADDRESSES OF DEFECTIVE MEMORY CELLS

(71) Applicant: Micron Technology, Inc., Boise, ID (US)

(72) Inventor: Masashi Oya, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/492,686

(22) Filed: Apr. 20, 2017

(65) Prior Publication Data
US 2017/0221588 A1 Aug. 3, 2017

Related U.S. Application Data

(63) Continuation of application No. 14/470,113, filed on Aug. 27, 2014, now Pat. No. 9,704,597.

(30) Foreign Application Priority Data

Aug. 27, 2013 (JP) ................................. 2013-175122

(51) Int. Cl.
*G11C 29/00* (2006.01)
*G11C 17/16* (2006.01)
*G11C 11/4076* (2006.01)
*G11C 29/12* (2006.01)

(52) U.S. Cl.
CPC .......... *G11C 29/78* (2013.01); *G11C 11/4076* (2013.01); *G11C 17/16* (2013.01); *G11C 29/12* (2013.01); *G11C 29/785* (2013.01); *G11C 29/835* (2013.01)

(58) Field of Classification Search
CPC ..... G11C 29/78; G11C 29/12; G11C 11/4076; G11C 11/408; G11C 17/16
See application file for complete search history.

(56) References Cited

U.S. PATENT DOCUMENTS

| 6,065,141 A * | 5/2000 | Kitagawa ........... G11C 29/4401 714/6.2 |
| 6,084,815 A * | 7/2000 | Matsushita ............ G11C 29/80 365/200 |
| 7,551,506 B2 * | 6/2009 | Mori .................... G11C 17/165 365/189.05 |
| 2002/0194546 A1 | 12/2002 | Ooishi |

(Continued)

FOREIGN PATENT DOCUMENTS

| JP | 05047196 | 2/1993 |
| JP | 2006107664 | 4/2006 |
| JP | 2013089261 | 5/2013 |

*Primary Examiner* — Son Dinh
*Assistant Examiner* — Jerome Leboeuf
(74) *Attorney, Agent, or Firm* — Dorsey & Whitney LLP

(57) ABSTRACT

A semiconductor device that includes a plurality of memory cells assigned with addresses that are different from each other, a redundant memory cell replacing a defective memory cell among the memory cells, a fuse circuit storing an address of the defective memory cell, an access control circuit accessing the redundant memory cell when the address of the defective memory cell stored in the fuse circuit is supplied, and a roll call circuit outputting the address of the defective memory cell to outside the semiconductor device in a serial manner.

18 Claims, 5 Drawing Sheets

(56) References Cited

U.S. PATENT DOCUMENTS

| | | |
|---|---|---|
| 2003/0107931 A1 | 6/2003 | Dono |
| 2008/0126876 A1 | 5/2008 | Lee |
| 2009/0010085 A1 | 1/2009 | Hojo et al. |
| 2009/0109790 A1* | 4/2009 | Miyatake .............. G11C 17/165 365/230.08 |
| 2010/0202183 A1 | 8/2010 | Kurjanowicz |
| 2012/0257462 A1 | 10/2012 | Cho |
| 2012/0307578 A1 | 12/2012 | Noguchi |
| 2013/0007510 A1* | 1/2013 | Noguchi .............. G11C 29/787 714/6.2 |
| 2013/0322149 A1 | 12/2013 | Ryu et al. |
| 2015/0063001 A1 | 3/2015 | Oya |

* cited by examiner

SEMICONDUCTOR DEVICE INCLUDING A ROLL CALL CIRCUIT FOR OUTPUTTING ADDRESSES OF DEFECTIVE MEMORY CELLS

CROSS REFERENCE TO RELATED APPLICATION(S)

This application is a continuation of U.S. patent application Ser. No. 14/470,113, filed Aug. 27, 2014 and issued as U.S. Pat. No. 9,704,597 on Jul. 11, 2017, which application claims priority to Japanese Application No. 2013-175122 filed Aug. 27, 2013. The aforementioned applications, and issued patent, are incorporated herein by reference, in their entirety, for any purpose.

BACKGROUND OF THE INVENTION

Embodiments of the present invention relate to a semiconductor device, and particularly to a semiconductor device that includes a roll call circuit.

In a semiconductor device such as DRAM (Dynamic Random Access Memory), redundant memory cells are provided in some cases to replace defective memory cells. The addresses of the defective memory cells are stored in fuse circuits. When the addresses are input, the fuse circuits activate a hit signal. After the hit signal becomes activated, the redundant memory cells are accessed instead of the defective memory cells thereby the addresses are relieved.

The addresses to be relieved are programmed into the fuse circuits during manufacturing process. Therefore before shipment, all the defective memory cells are replaced with the redundant memory cells. As a result, all addresses have been assigned to good memory cells. Accordingly, a user does not have to know which address is linked to a defective memory cell.

However, at the time of evaluating or designing the semiconductor devices, someone may need to check, from outside, which address is linked to a defective memory cell, or which defective memory cell is replaced with a redundant memory cell. To meet such a need, a semiconductor device such as DRAM may include a roll call circuit that makes it possible to check, from outside, the addresses programmed into the fuse circuits (see Japanese Patent Application Laid-open No. H05-47196 (Patent Document 1), Japanese Patent Application Laid-open No. 2006-107664 (Patent Document 2), and Japanese Patent Application Laid-open No. 2013-89261 (Patent Document 3)).

However, each of the roll call circuits disclosed in Patent Documents 1 and 2 is configured to output the above hit signal to the outside. Therefore, in order to know which address is programmed into the fuse circuits, all the addresses need to be input to the semiconductor devices. Accordingly, the problem is that it takes time to perform evaluation work by using the roll call circuits. On the other hand, the roll call circuit disclosed in Patent Document 3 succeeds in solving the problem of Patent Documents 1 and 2; the roll call operation is possible without all the addresses being input to the semiconductor device. However, even in the case of the semiconductor device disclosed in Patent Document 3, addresses need to be input to the semiconductor device multiple times during the roll call operation.

SUMMARY

In one embodiment, there is provided a semiconductor device that includes: a plurality of memory cells assigned with addresses that are different from each other; a redundant memory cell replacing a defective memory cell among the memory cells; a fuse circuit storing an address of the defective memory cell; an access control circuit accessing the redundant memory cell when the address of the defective memory cell stored in the fuse circuit is supplied; and a roll call circuit outputting the address of the defective memory cell to outside in a serial manner.

According to the present invention, the address of a defective memory cell stored in the fuse circuit can be output directly to the outside. Therefore, it is possible to reduce the time required to perform evaluation work by using the roll call circuit. Moreover, since the address of the defective memory cell is output in a serial manner, using a minimum number of external terminals is sufficient.

DETAILED DESCRIPTION OF THE EMBODIMENTS

Embodiments of the present invention will be explained below in detail with reference to the accompanying drawings.

Figure 1:
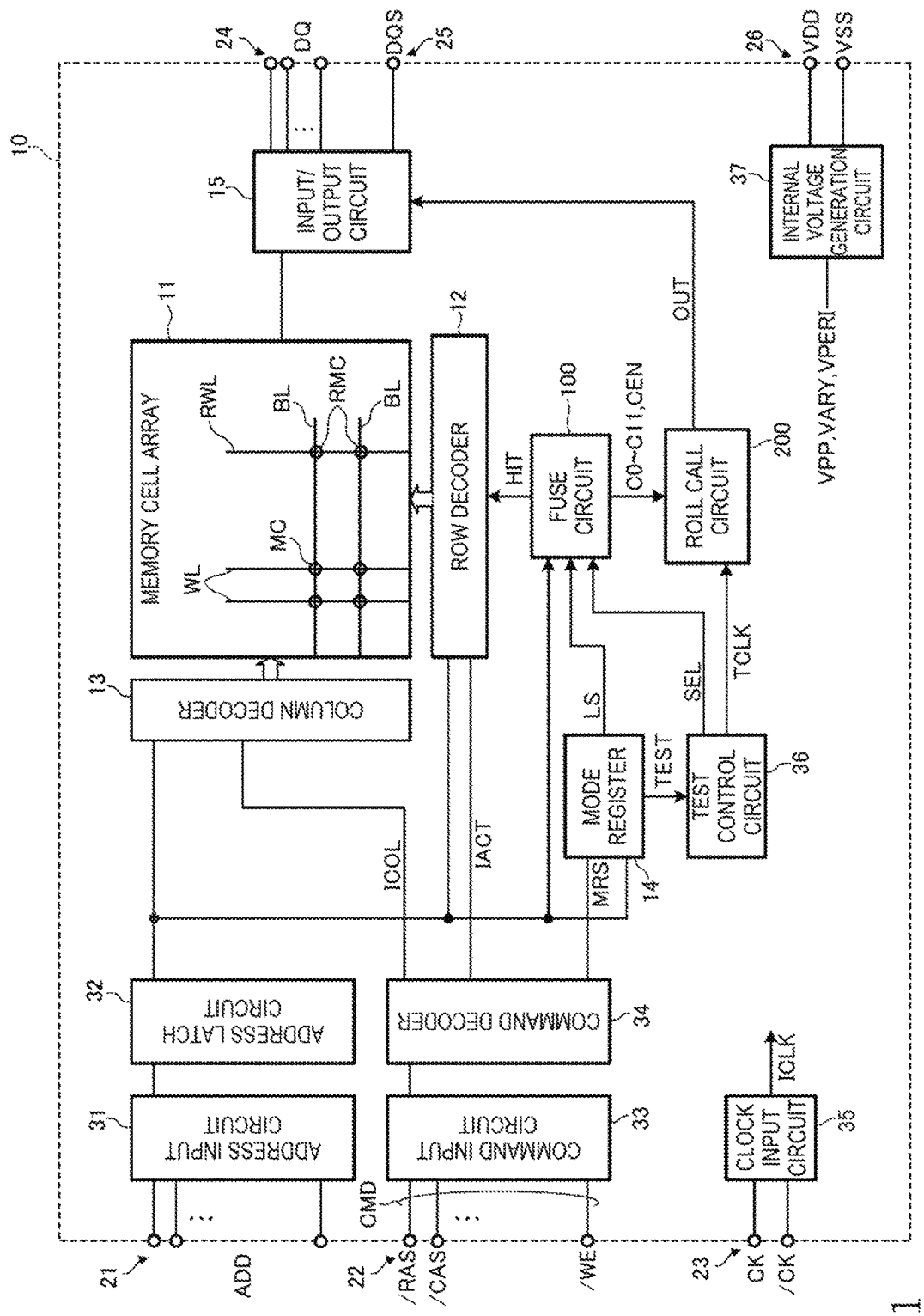
FIG. 1 is a block diagram showing the overall configuration of a semiconductor device according to an embodiment of the present invention.

Referring now to FIG. 1, the semiconductor device 10 according to the embodiment of the present invention is DRAM including a memory cell array 11. The memory cell array 11 includes a plurality of word lines WL to which different addresses are respectively assigned, and a plurality of bit lines BL to which different addresses are respectively assigned. The memory cell array 11 also includes memory cells MC which are respectively located at the intersections of the word lines WL and the bit lines BL. The word lines WL are selected by a row decoder 12. The bit lines BL are selected by a column decoder 13. Furthermore, the memory cell array 11 includes redundant word lines RWL. At the intersections of the redundant word lines RWL and the bit lines BL, redundant memory cells RMC are respectively disposed. The redundant word lines RWL are spare word lines each of which can replaces a defective word line WL or a word line WL that is connected to a defective memory cell MC. FIG. 1 only shows one redundant word line RWL. However, in the present embodiment, the memory cell array 11 includes at least 178 redundant word lines (RWL0 to RWL177).

As shown FIG. 1, the semiconductor device 10 includes external terminals that include address terminals 21, command terminals 22, clock terminals 23, data terminals 24, a data strobe terminal 25, and power supply terminals 26.

The address terminals 21 are supplied with an address signal ADD from the outside. The address signal ADD that is input to the address terminals 21 is supplied to an address latch circuit 32 via an address input circuit 31. The address signal ADD is then latched by the address latch circuit 32. The address signal ADD latched the address latch circuit 32 is supplied to the row decoder 12, the column decoder 13, a mode register 14. The mode register 14 is a circuit in which a parameter indicating the operation mode of the semiconductor device 10 is set. The address signal ADD is also supplied to a fuse circuit 100, which will be described later.

The command terminals 22 are supplied with a command signal CMD from outside the semiconductor device 10. The command signal CMD consists of a plurality of signals including a row address strobe signal /RAS, a column address strobe signal /CAS, and write enable signal /WE. The names of the signals that start with slash (/) indicate that those signals are inverted signals of corresponding signals or low-active signals. The command signal CMD that is input to the command terminals 22 is supplied to a command decoder 34 via a command input circuit 33. The command decoder 34 generates various internal commands by decoding the command signal CMD. The internal commands include an active signal IACT, a column signal ICOL, and a mode register set signal MRS.

The active signal IACT is activated when the command signal CMD indicates row access (active command). After the active signal IACT becomes activated, the address signal ADD latched by the address latch circuit 32 is supplied to the row decoder 12. As a result, a word line WL specified by the address signal ADD is selected.

The column signal ICOL is activated when the command signal CMD indicates column access (read command or write command). After the column signal ICOL becomes activated, the address signal ADD latched by the address latch circuit 32 is supplied to the column decoder 13. As a result, a bit line BL specified by the address signal ADD is selected.

Therefore, if the active command and the read command are input in this order, and the row address and the column address are input in synchronization with the commands, read data is read from a memory cell MC specified the row and column addresses. The read data DQ is output from the data terminals 24 via an input/output circuit 15 in synchronization with the data strobe signal DQS output from the data strobe terminal 25. If the active command and the write command are input in this order, and the row address and the column address are input in synchronization with the commands, and then write data DQ is input to the data terminals 24 in synchronization with the data strobe signal DQS, the write data DQ is supplied to the memory cell array 11 via the input/output circuit 15, and is written into a memory cell MC specified by the row and column addresses.

The mode register set signal MRS is activated when the command signal CMD indicates a mode register set entry command. Therefore, if the mode register set entry command is input and a mode signal is input through the address terminals 21 in synchronization with the command, a value set in the mode register 14 is rewritten. If a test mode is set in the mode register 14, a test mode signal TEST is output from the mode register 14. The test mode signal TEST is supplied to a test control circuit 36, which will be described later.

The clock terminals 23 are supplied with external clock signals CK and /CK. The external clock signal CK and the external clock signal /CK are complementary to each other, both are supplied to a clock input circuit 35. The clock input circuit 35 generates an internal clock signal ICLK based on the external clock signals CK and /CK. The internal clock signal ICLK is a clock signal inside the semiconductor device 10. The internal clock signal ICLK is used as a timing signal that defines the operation timing of the address latch circuit 32, the command decoder 34, as well as other internal circuits.

The power supply terminals 26 are supplied with power supply potentials VDD and VSS. The power supply potentials VDD and VSS that are supplied to the power supply terminals 26 are supplied to an internal voltage generation circuit 37. The internal voltage generation circuit 37 generates various internal potentials, such as VPP, VARY, and VPERI, based on the power supply potentials VDD and VSS. The internal potential VPP is mainly used in the row decoder 12. The internal potential VARY is used in the memory cell array 11. The internal potential VPERI is used in many other circuit blocks.

As shown in FIG. 1, the semiconductor device 10 of the present embodiment further includes the fuse circuit 100 and a roll call circuit 200.

The fuse circuit 100 may store an address of a defective word line WL. Here, the defective word line WL means not only a word line WL that itself is defective, but also a word line WL connected to a defective memory cell MC. An address signal ADD (e.g., row address) at the time of row access is input to the fuse circuit 100. If the input row address matches the address stored in the fuse circuit 100, the hit signal HIT is activated. The hit signal HIT is supplied to the row decoder 12 which is an access control circuit. When the hit signal HIT is not activated, the row decoder 12 selects a certain word line WL based on a row address supplied through the address latch circuit 32. When the hit signal HIT is activated, the row decoder 12 selects a certain redundant word line RWL based on the hit signal HIT. This operation leads to substitute access to the redundant word line RWL, not to the defective word line WL, when access to the defective word line WL is requested.

Figure 2:
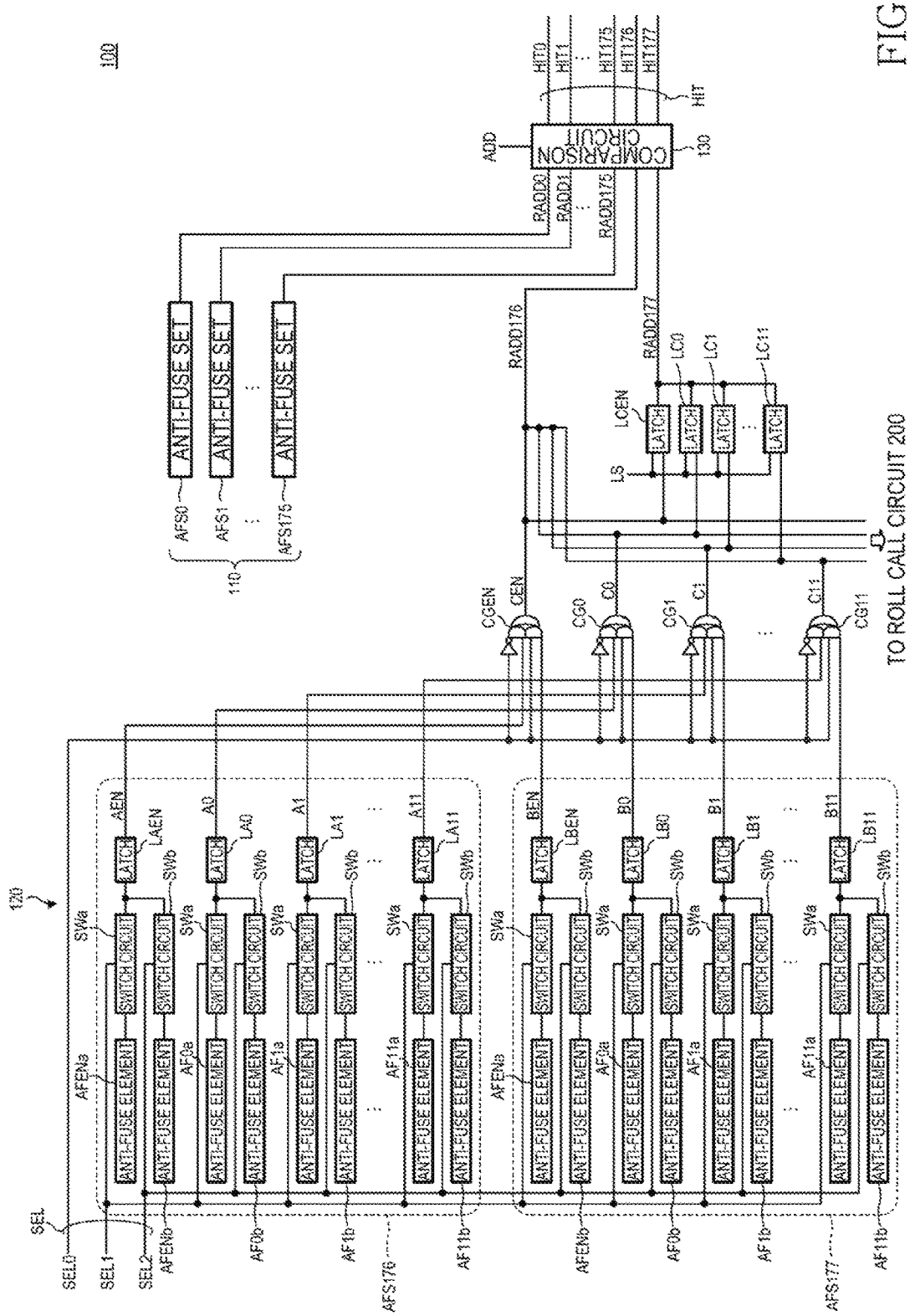
FIG. 2 is a circuit diagram showing major portions of the fuse circuit shown in FIG. 1.

Turning to FIG. 2, the fuse circuit 100 includes a first storage circuit 110 and a second storage circuit 120. Each of the storage circuits 110 and 120 is a circuit in which addresses of defective word lines WL are stored. Although not specifically limited, each circuit includes a plurality of anti-fuse elements. The anti-fuse elements are nonvolatile storage elements. When the anti-fuse elements are not programmed, the anti-fuse elements are in a non-conductive state; the anti-fuse elements change a to conductive state after being programmed. Therefore, the anti-fuse elements can memorize the logic level of each of the bits that make up an address.

In this case, the address of a defective word line WL discovered on a wafer is stored in the first storage circuit 110, and the address of a defective word line WL discovered after packaging is stored in the second storage circuit 120. Although not specifically restricted, in the case of the present embodiment, 176 anti-fuse sets AFS0 to AFS175 are allocated to the first storage circuit 110, and two anti-fuse sets AFS176 and AFS177 are allocated to second storage circuit 120. An anti-fuse set is a unit capable of memorizing one address. Accordingly, the use of the first storage circuit makes it possible to replace up to 176 defective word lines WL with redundant word lines RWL (RWL0 to RWL175). The use of the second storage circuit 120 makes it possible to replace up to two defective word lines WL with redundant word lines RWL (RWL176 and RWL177). A majority of defective word lines WL is discovered on a wafer. Therefore, a large number of anti-fuse sets are allocated to the first storage circuit 110.

In most of semiconductor devices 10 on a wafer, all addresses are relieved by a process by the first storage circuit 110 of replacing word lines. However, if the number of defective word lines WL exceeds the number of anti-fuse sets in the first storage circuit 110, not all of the addresses are relieved. In this case, those semiconductor devices are discarded as defective products.

A semiconductor device 10 in which all the addresses have been relieved by the first storage circuit 110 is temporarily recognized as a good product. However, in the processes that follow (or subsequent processes), a new defective portion may emerge. There are various possible causes. However, the effects of heat during a packaging process are considered mainly responsible for the defective portion. If a new defective word line WL emerges in the subsequent processes, secondary relief operation is performed by using the second storage circuit 120. The number of new defective word lines WL emerging in the subsequent process is very small. Therefore, according to the present embodiment, the two anti-fuse sets AFS176 and AFS177 are used so that only two defective word lines WL will be replaced. Incidentally, if the memory cell array 11 is divided into a plurality of banks, one of the anti-fuse sets, AFS176, may be allocated to certain banks (e.g., banks 0 to 3), and the other anti-fuse set AFS177 may be allocated to the remaining banks (e.g., banks 4 to 7).

As shown in FIG. 2, the addresses RADD0 to RADD175 of defective word lines WL are output from the anti-fuse sets AFS0 to AFS175 of the first storage circuit 110. According to the present embodiment, each of the addresses RADD0 to RADD175 consists of 12-bits. If one enable bit necessary, each address consists of 13-bits.

Similarly, the addresses RADD176 and RADD177 of defective word lines WL are output from the anti-fuse sets AFS176 and AFS177 of the second storage circuit 120. Each of the addresses RADD176 and RADD177 consists of 12-bits. If one enable bit is necessary, each address consists of 13-bits.

The addresses RADD0 to RADD177 are supplied to a comparison circuit 130 shown in FIG. 2. The comparison circuit 130 compares an address signal ADD supplied from the outside with the addresses RADD0 to RADD177 of the defective word lines WL. If the address signal ADD matches one of the addresses RADD0 to RADD177, corresponding hit signals HIT0 to HIT177 are activated. In this case, the hit signals HIT0 to HIT177 correspond to the hit signal HIT shown in FIG. 1. If one of hit signals HIT0 to HIT177 is activated, then the row decoder 12 selects a redundant word line (one of the lines RWL0 to RWL177) corresponding to the one of hit signals HIT0 to HIT177 that is activated instead of a word line WL corresponding to an address signal ADD that is supplied from the outside. In this manner, the redundant word line RWL properly replaces the defective word line WL, and the address thereof is relieved.

The second storage circuit 120 will be described in more detail.

As described above, the second storage circuit 120 includes the two anti-fuse sets AFS176 and AFS177. As shown in FIG. 2, the anti-fuse sets AFS176 and AFS177 each includes anti-fuse elements AF0a to AF11a and AF0b to AF11b, each of which corresponds to each bit of a row address. Each of the anti-fuse sets AFS176 and AFS177 further includes two anti-fuse elements AFENa and AFENb which correspond to enable bits.

The anti-fuse elements AF0a to AF11a and AFENa in the anti-fuse set AFS176 are connected to corresponding latch circuits LA0 to LA11 and LAEN via switch circuits SWa. The anti-fuse elements AF0b to AF11b and AFENb in the anti-fuse set AFS176 are connected to corresponding latch circuits LA0 to LA11 and LAEN via switch circuits SWb.

Similarly, the anti-fuse elements AF0a to AF11a and AFENa in the anti-fuse set AFS177 are connected to corresponding latch circuits LB0 to LB11 and LBEN via switch circuits SWa. The anti-fuse elements AF0b to AF11b and AFENb in the anti-fuse set AFS177 are connected to corresponding latch circuits LB0 to LB11 and LBEN via switch circuits SWb.

Output nodes of the switch circuits SWa and SWb are wired-OR connected. Accordingly, if at least one of two anti-fuse elements is being programmed, one logic level (e.g., high level) is latched by a corresponding latch circuit. If the two anti-fuse elements are not being programmed, the other logic level (e.g., low level) is latched by a corresponding latch circuit.

The reason why two anti-fuse elements are allocated to each bit of a row address and an enable bit is that, even if the programming of one anti-fuse element fails, a correct logic level can be maintained as long as the programming of the other anti-fuse element is successful. The failure of the programming includes the case where the anti-fuse element fails to be changed from a non-conductive state to a conductive state, but also includes the case where the anti-fuse element is determined during anti-fuse evaluation to be in a non-conductive state (e.g., because of a relatively high resistance value thereof) even after the anti-fuse element has been programmed. In the case the present invention, allocating two anti-fuse elements to each bit is not necessarily required. However, such redundancy enables the storage of the correct logic level even if the chance of successful programming is not sufficient. Therefore, if the chance of successful programming is sufficiently high, only one anti-fuse element may be allocated to each bit. If the chance of successful programming is much lower, three or more anti-fuse elements may be allocated to each bit.

The latch circuits LA0 to LA11 and LAEN in the anti-fuse set AFS176 output bit signals A0 to A11 and AEN, which are input to corresponding compound logic gate circuits CG0 to CG11 and CGEN, respectively. Similarly, the latch circuits LB0 to LB11 and LBEN in anti-fuse set AFS177 output bit signals B0 to B11 and BEN, which are input to corresponding compound logic gate circuits CG0 to CG11 and CGEN, respectively. A selection signal SEL0 is supplied in common to the compound logic gate circuits CG0 to CG11 and CGEN. If the selection signal SEL0 is at one logic level (low level), the output signals from the anti-fuse set AFS176 are selected. If the selection signal SEL0 is at the other logic level (high level), the output signals from the anti-fuse set AFS177 are selected. The selection signal SEL0 is part of the selection signal SEL shown in FIG. 1. However, instead, part or all of selection signals SEL0 to SEL2 that make up the selection signal SEL may be output from the mode register 14.

Bit signals C0 to C11 and CEN that are output from the compound logic gate circuits CG0 to CG11 and CGEN are directly used as an address RADD176. The bit signals C0 to C11 and CEN are also used as an address RADD177 after passing through latch circuits LC0 to LC11 and LCEN. As described above, the addresses RADD176 and RADD177 are supplied to the comparison circuit 130, and are used for generation of the hit signals HIT176 and HIT177.

The latch circuits LC0 to LC11 and LCEN are circuits of a through-latch type, which perform a latch operation in response to a latch signal LS. When the latch signal LS is at high level, the latch circuits LC0 to LC11 and LCEN output an input signal without changing the input signal. When the latch signal LS is at low level, the latch circuits LC0 to LC11 and LCEN fix the logic level of the output signal. The latch signal LS is output from the mode register 14.

Figure 3:
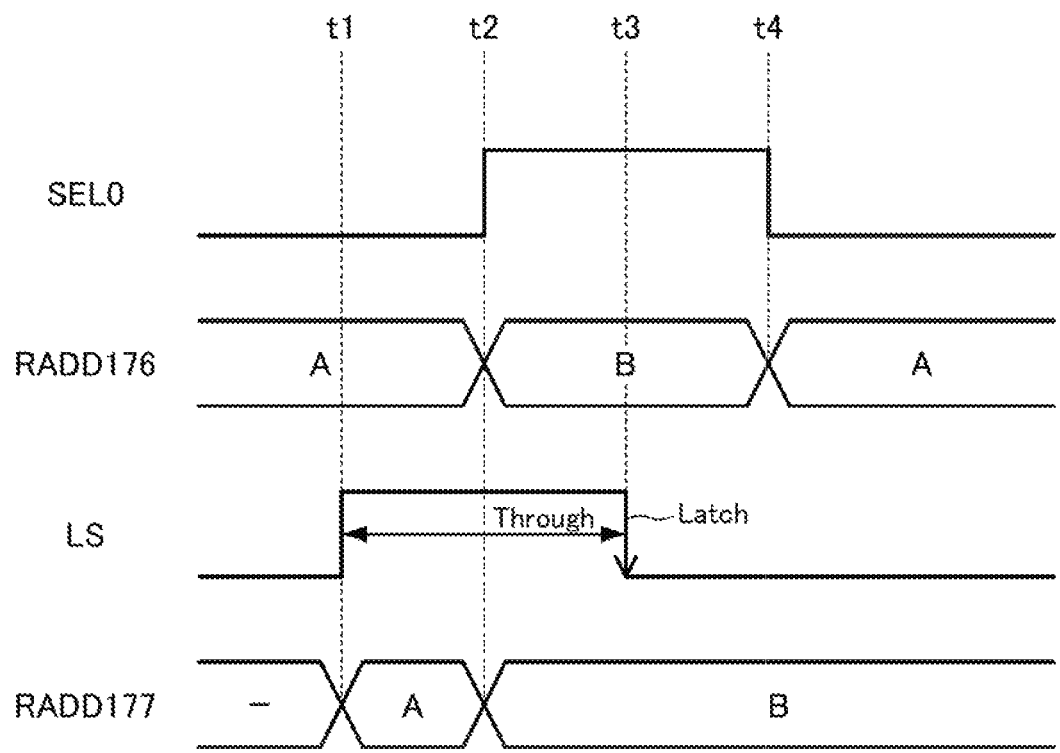
FIG. 3 is a timing chart showing how a selection signal and a latch signal change.

Turning to FIG. 3, data "A" represents the signals output from the anti-fuse set AFS176, and data "B" represents the signals output from the anti-fuse set AFS177.

In the example shown in FIG. 3, the latch signal LS is at high level during a period of time t1 to t3. During a period of time t2 to t4, the selection signal SEL0 is at high level. During the period in which the selection signal SEL0 is at low level, the value of the address RADD176 is "A". During the period in which the selection signal SEL0 is at high level, the value of the address RADD176 is "B".

At time t1 when the latch signal LS is changed to high level, the latch circuits LC0 to LC11 and LCEN go into the state of outputting an input signal without changing the input signal (through state). Accordingly, the value of the address RADD177 is "A" during the period of time t1 to t2, and the value of the address RADD177 is "B" during the period of time t2 to t3.

Then, at time t3 when the latch signal LS is changed to low level, the outputs of the latch circuits LC0 to LC11 and LCEN are fixed to "B", which is a value that the latch circuits LC0 to LC11 and LCEN take at that time. Therefore, the value of the address RADD177 is "B". Then, at time t4 when the selection signal SEL0 has fallen to low level, the value of the address RADD176 goes back to "A". As a result, the values of the addresses RADD176 and RADD177 become "A" and "B", respectively.

Figure 4:
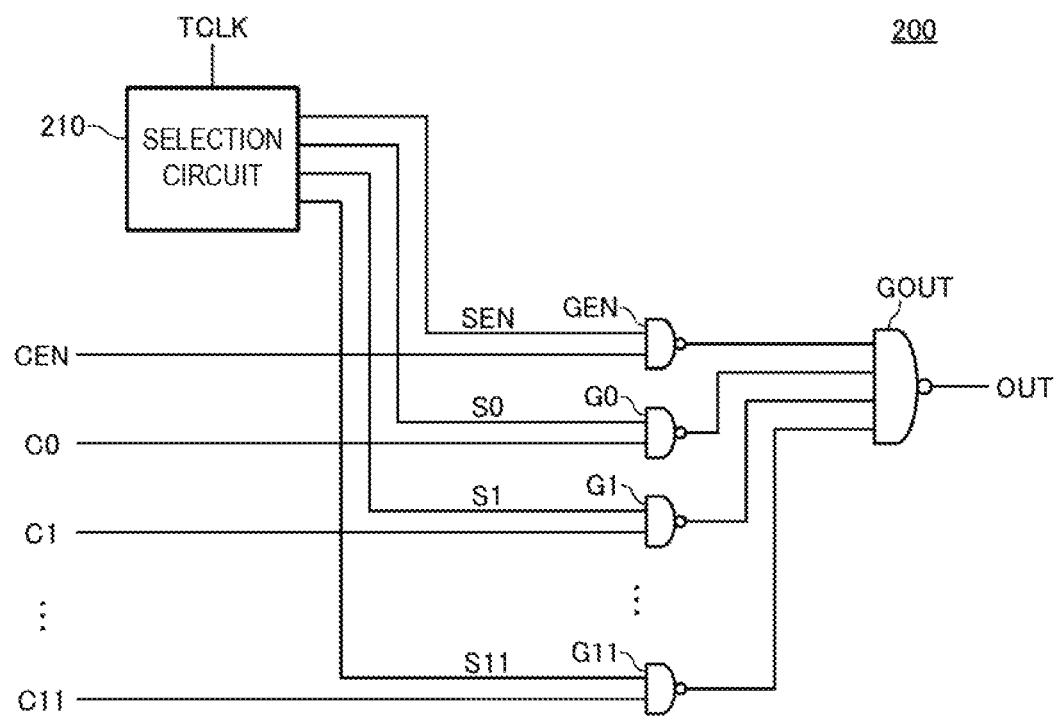
FIG. 4 is a circuit diagram showing the roll call circuit shown in FIG. 1.

Turning to FIG. 4, the roll call circuit 200 includes a plurality of NAND gate circuits G0 to G11 and GEN and a NAND gate circuit GOUT. Bit signals C0 to C11 and CEN are input to one-side input nodes of the NAND gate circuits G0 to G11 and GEN, respectively, and selection signals S0 to S11 and SEN are input to the other-side input nodes of the NAND gate circuits G0 to G11 and GEN, respectively. The roll call circuit 200 further includes the NAND gate circuit GOUT that receives output signals of the NAND gate circuits G0 to G11 and GEN. Only one of the selection signals S0 to S11 and SEN is exclusively activated. The selection signals S0 to S11 and SEN are generated by a selection circuit 210. The selection circuit 210 performs a toggle operation in synchronization with a test clock signal TCLK that is output from the test control circuit 36, thereby sequentially activating the selection signals S0 to S11 and SEN.

A signal OUT that is output from the NAND gate circuit GOUT is supplied to the input/output circuit 15 shown in FIG. 1, and is output to the outside via the data strobe terminal 25. As a result, the data strobe terminal 25 outputs the values of the bit signals C0 to C11 and CEN in a serial manner in synchronization with the test clock signal TCLK.

Figure 5:
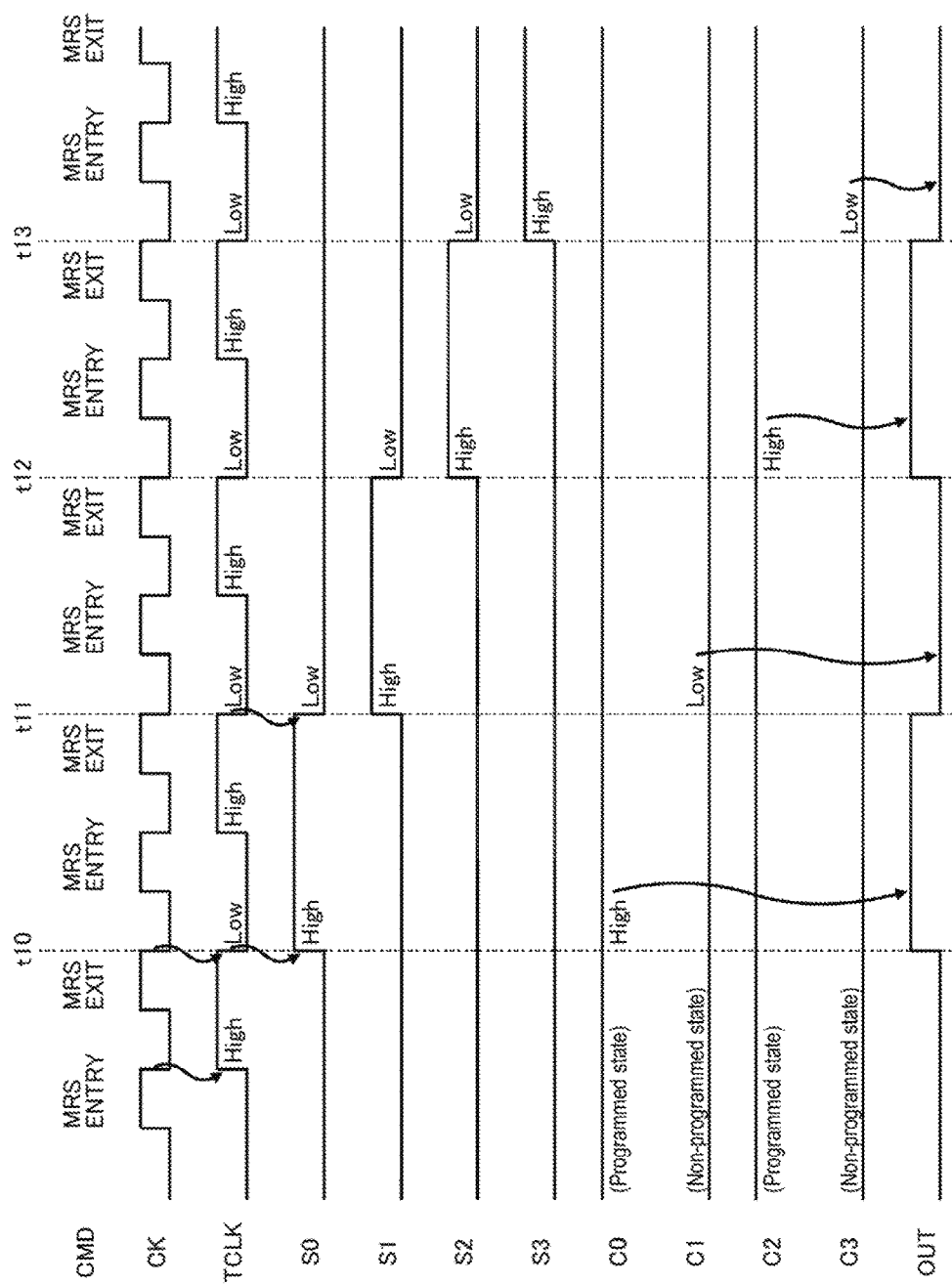
FIG. 5 is a timing chart for explaining a roll call operation of the semiconductor device shown in FIG. 1.

Turning to FIG. 5, a mode register set entry command (MRS ENTRY) and a mode register set exit command (MRS EXIT) are alternately issued. Therefore, the selection circuit 210 in the roll call circuit 200 performs the toggle operation. More specifically, if the mode register set entry command (MRS ENTRY) is issued via the command terminals 22, and a predetermined mode signal is supplied via the address terminals 21, then the test mode signal TEST becomes activated. In response, the test control circuit 36 changes the test clock signal TCLK to level. Then, as the mode register set exit command (MRS EXIT) is issued via the command terminals 22, the test mode signal TEST becomes inactivated. In response, the test control circuit 36 changes the test clock signal TCLK to low level.

As such an operation is repeated, the logic level of the test clock signal TCLK is alternately changed as shown in FIG. 5. According to the present embodiment, each time the test clock signal TCLK falls from high level to low level, the selection circuit 210 performs the toggle operation, thereby switching the selection signals S0 to S11 and SEN to be activated (or brought to high level). As one of the selection signals S0 to S11 and SEN is activated to high level, the logic level of a corresponding one of the bit signals C0 to C11 and CEN is reflected in the logic level of the signal OUT. That is, the logic level of the corresponding one of the bit signals C0 to C11 and CEN is directly read out.

In the example shown in FIG. 5, the bit signals C0 and C2 are at high level (or in the state of being programmed), and the bit signals C1 and C3 are at low level (or in the state of not being programmed). The other bit signals C4 to C11 and the enable bit CEN are omitted in the diagram.

During a period of time t10 to t11, the selection signal S0 is activated to high level. Therefore, the value of the bit signal C0 is output as the signal OUT. Similarly, the selection signals S1, S2, and S3 are activated to high level during the period t11 to t12, the period t12 to t13, and the period that follows time t13, respectively. As a result, the values of the bit signals C1, C2, and C3 are sequentially output as the signal OUT.

As the selection circuit 210 performs the toggle operation, the bit signals C0 to C11 and CEN are read out in a serial manner, and are supplied to the input/output circuit 15 shown in FIG. 1. The input/output circuit 15 outputs the signals to the outside via the data strobe terminal 25. Thus, an external tester can acquire the values of the bit signals C0 to C11 and CEN without any changes in the values.

As described above, the bit signals C0 to C11 and CEN are either the value "A" or "B", which is selected based on the selection signal SEL0. That is, the bit signals C0 to C11 and CEN are the value being programmed in the anti-fuse set AFS176 or AFS177. Therefore, if the selection signals SEL are switched, and the above toggle operation is repeated, each of the values programmed into the anti-fuse sets AFS176 and AFS177 can be output to the outside.

Moreover, according to the present embodiment, by controlling the switch circuits SWa and SWb, it is possible to know whether each anti-fuse element is in the state of being programmed or in the state of not being programmed. That is, the anti-fuse sets AFS176 and AFS177 are so configured as to store one bit by using two anti-fuse elements. To the two anti-fuse elements, the switch circuits SWa and SWb are respectively allocated. As shown in FIG. 2, the selection signals SEL1 and SEL2 are supplied to the switch circuits SWa and SWb, respectively. The switch circuits SWa and SWb are separately made conductive or nonconductive by the selection signals SEL1 and SEL2. The selection signals SEL1 and SEL2 are signals that are output from the test control circuit 36. In normal operation, both the selection signals SEL1 and SEL2 are in an active state.

During the roll call operation, as only one of the selection signals SEL1 and SEL2 is activated, it becomes possible to separately detect the programming state of the two anti-fuse elements that store one bit. Needless to say, if both the selection signals SEL1 and SEL2 are activated, it is possible to detect the state of wired-OR connecting the two anti-fuse elements that store one bit, or to detect the bit signals A0 to A11 and AEN or B0 to B11 and BEN that are normally used.

In order to find out the chance of successful programming, it is necessary to recognize the programming state of each anti-fuse element, which will be important data at the time of designing. As described above, in the semiconductor device 10 of the present embodiment, it is possible to know not only the values being programmed in the anti-fuse sets AFS176 or AFS177 but also the programming state of each anti-fuse element. Moreover, according to the present embodiment, the programmed values are directly read out. Therefore, unlike the conventional semiconductor devices, there is no need to input an address. Thus, the roll call operation can be finished in a very short time.

It is apparent that the present invention is not limited to the above embodiments, but may be modified and changed without departing from the scope and spirit of the invention.

For example, what is described in the above embodiment is an example in which the present invention is applied to DRAM. However, the application of the present invention is not limited to DRAM. The present invention may be applied to all semiconductor devices that include a roll call circuit.

Moreover, according to the above embodiment, a roll call operation is performed on an anti-fuse set in which a defective address generated after packaging is stored. However, the target of the roll call operation is not limited to that anti-fuse set.

Furthermore, according to the above embodiment, the addresses of defective word lines WL are memorized by anti-fuse elements. However, the present invention is not limited to that configuration. Instead, laser fuses, which are programmed by laser irradiation, may be used.

Furthermore, according to the above embodiment, the fuse circuits in which row addresses are stored have been described. Similarly, the roll call operation may be performed on the fuse circuits in which column addresses are stored. Moreover, the present invention can be applied not only to the case where replacement takes place on a per-word-line basis, but also to the case where replacement takes place on a per-memory-cell basis.

What is claimed is:

1. An apparatus comprising:
    a plurality of fuse circuits each including a fuse, each of the plurality of fuse circuits being configured to produce a fuse data signal, the fuse data signal being configured to be at a first logic state when a respective fuse is blown and at a second logic state when the respective fuse is not blown;
    a plurality of logic gate circuits each including a first input node, second input node and an output node, each of the plurality of logic gate circuits being configured to receive at the first input node the fuse data signal of a corresponding one of the plurality of fuse circuits, each of the plurality of logic gate circuits being further configured to produce at the output node a first signal related to the fuse data signal of a corresponding one of the plurality of fuse circuits responsive to the second input node receiving an active level and to produce at the output node a second signal unrelated to the fuse data signal of the corresponding one of the plurality of fuse circuits responsive to the second input node receiving an inactive level;
    a selection circuit coupled to the second input node of each of the plurality of logic gate circuits, the selection circuit being configured to supply the second input node of each of the plurality of logic gate circuits with a selected one of the active level and the inactive level;
    a plurality of terminals to communicate outside of the apparatus; and
    an additional logic gate circuit including a plurality of input nodes, each of the plurality of input nodes of the additional logic gate circuit being coupled to the output node of a corresponding one of the plurality of logic gate circuits, wherein a data strobe terminal of the plurality of terminals communicates an output signal of the additional logic gate circuit.

2. The apparatus of claim 1, wherein the selection circuit includes a plurality of selection lines, each of the selection lines being coupled to the second input node of a corresponding one of the plurality of logic gate circuits, and the selection circuit being further configured to perform a toggle operation to supply the plurality of selection lines with the active level exclusively.

3. The apparatus of claim 2, wherein the selection circuit is configured to perform the toggle operation responsive to a clock signal.

4. The apparatus of claim 3, wherein the clock signal is generated in a test mode.

5. The apparatus of claim 2, wherein the selection circuit is configured to supply the plurality of selection lines with the active level one by one.

6. The apparatus of claim 1, wherein each of the plurality of logic gate circuits comprises a NAND gate circuit.

7. The apparatus of claim 1, wherein the selection circuit includes a plurality of selection lines, each of the selection lines being coupled to the second input node of a corresponding one of the plurality of logic gate circuits, and the selection circuit being further configured to perform a toggle operation to supply the plurality of selection lines with the active level one by one; and
    wherein the additional logic gate circuit is configured to produce an output signal related to the first signal of one of the plurality of logic gate circuits that receives the active level at the second input node via an associated one of the plurality of selection lines.

8. The apparatus of claim 7, wherein each of the plurality of logic gate circuits comprises a first NAND gate circuit and the additional logic gate circuit comprises a second NAND gate circuit.

9. The apparatus of claim 7, wherein the selection circuit is configured to perform the toggle operation responsive to a test clock signal.

10. An apparatus comprising:
    a memory array including a plurality of memory cells and at least one defective memory cell, the defective memory cell being designated by a defective address, the defective address comprising a plurality of bits, each of the bits being at one of first and second logic levels;
    a fuse circuit configured to store the defective address, the fuse circuit comprising a plurality of fuse elements each corresponding to a bit of the plurality of bits of the defective address, each of the plurality of fuse elements being configured to output a fuse data signal indicative of a logic level of the corresponding bit of the plurality of bits of the defective address; and
    a roll call circuit coupled to the fuse circuit;
    wherein the roll call circuit comprises:
        a plurality of logic gate circuits each including a first input node, second input node and an output node, each of the plurality of logic gate circuits being configured to receive at the first input node the fuse data signal of a corresponding one of the plurality of fuse elements, each of the plurality of logic circuits being further configured to produce at the output node a first signal related to the fuse data signal of a corresponding one of the plurality of fuse elements responsive to the second input node receiving an active level and to produce at the output node a second signal unrelated to the fuse data signal of the corresponding one of the plurality of fuse elements responsive to the second input node receiving an inactive level;
a selection circuit coupled to the second input node of each of the plurality of logic gate circuits, the selection circuit being configured to supply the second input node of each of the plurality of logic gate circuits with a selected one of the active level and the inactive level; and
an additional logic gate circuit including a plurality of input nodes, each of the plurality of input nodes of the additional logic gate circuit being coupled to the output node of a corresponding one of the plurality of logic gate circuits, the additional logic gate circuit is configured to output each of the plurality of bits of the defective address to a data strobe terminal of a plurality of terminals.

11. The apparatus of claim 10, further comprising a plurality of terminals to communicate outside of the apparatus, the additional logic gate circuit being coupled at an output node thereof to one of the plurality of terminals.

12. The apparatus of claim 11, wherein the additional logic gate circuit is configured to output each of the plurality of bits of the defective address to the one of the plurality of terminals in serial manner.

13. An apparatus comprising:
a memory array including a plurality of memory cells and at least one defective memory cell, the defective memory cell being designated by a defective address, the defective address comprising a plurality of bits, each of the bits being at one of first and second logic levels;
a fuse circuit configured to store the defective address, the fuse circuit comprising a plurality of fuse elements each corresponding to a bit of the plurality of bits of the defective address, each of the plurality of fuse elements being configured to output a fuse data signal indicative of a logic level of the corresponding bit of the plurality of bits of the defective address;
a plurality of terminals to communicate outside of the apparatus; and
a roll call circuit coupled to the fuse circuit;
wherein the roll call circuit comprises:
a plurality of logic gate circuits each including a first input node, second input node and an output node, each of the plurality of logic gate circuits being configured to receive at the first input node the fuse data signal of a corresponding one of the plurality of fuse elements, each of the plurality of logic circuits being further configured to produce at the output node a first signal related to the fuse data signal of a corresponding one of the plurality of fuse elements responsive to the second input node receiving an active level and to produce at the output node a second signal unrelated to the fuse data signal of the corresponding one of the plurality of fuse elements responsive to the second input node receiving an inactive level;
a selection circuit coupled to the second input node of each of the plurality of logic gate circuits, the selection circuit being configured to supply the second input node of each of the plurality of logic gate circuits with a selected one of the active level and the inactive level; and
an additional logic gate circuit including a plurality of input nodes, each of the plurality of input nodes of the additional logic gate circuit being coupled to the output node of a corresponding one of the plurality of logic gate circuits, the additional logic gate circuit being coupled at an output node thereof to one of the plurality of terminals wherein the additional logic gate circuit is configured to output each of the plurality of bits of the defective address to the one of the plurality of terminals in serial manner, and wherein the plurality of terminals includes a data strobe terminal, the data strobe terminal being used as the one of the plurality of terminals.

14. The apparatus of claim 10, wherein the selection circuit includes a plurality of selection lines, each of the selection lines being coupled to the second input node of a corresponding one of the plurality of logic gate circuits, and the selection circuit being further configured to perform a toggle operation to supply the plurality of selection lines with the active level one by one; and
wherein the additional logic gate circuit is configured to produce an output signal related to the first signal of one of the plurality of logic gate circuits that receives the active level at the second input node via an associated one of the plurality of selection lines.

15. The apparatus of claim 14, wherein each of the plurality of logic gate circuits comprises a first NAND gate circuit and the additional logic gate circuit comprises a second NAND gate circuit.

16. The apparatus of claim 14, wherein the selection circuit is configured to perform the toggle operation responsive to a test clock signal.

17. The apparatus of claim 14, further comprises a plurality of terminals to communicate outside of the apparatus, the additional logic gate circuit being further configured to provide the output signal to one of the plurality of terminals.

18. An apparatus comprising:
a memory array including a plurality of memory cells and at least one defective memory cell, the defective memory cell being designated by a defective address, the defective address comprising a plurality of bits, each of the bits being at one of first and second logic levels;
a fuse circuit configured to store the defective address, the fuse circuit comprising a plurality of fuse elements each corresponding to a bit of the plurality of bits of the defective address, each of the plurality of fuse elements being configured to output a fuse data signal indicative of a logic level of the corresponding bit of the plurality of bits of the defective address;
a plurality of terminals to communicate outside of the apparatus; and
a roll call circuit coupled to the fuse circuit:
wherein the roll call circuit comprises:
a plurality of logic gate circuits each including a first input node, second input node and an output node, each of the plurality of logic gate circuits being configured to receive at the first input node the fuse data signal of a corresponding one of the plurality of fuse elements, each of the plurality of logic circuits being further configured to produce at the output node a first signal related to the fuse data signal of a corresponding one of the plurality of fuse elements responsive to the second input node receiving an active level and to produce at the output node a second signal unrelated to the fuse data signal of the corresponding one of the plurality of fuse elements responsive to the second input node receiving an inactive level;
a selection circuit coupled to the second input node of each of the plurality of logic gate circuits, the selection circuit being configured to supply the second input node of each of the plurality of logic gate circuits with a selected one of the active level and the inactive level; and an additional logic gate circuit including a plurality of input nodes, each of the plurality of input nodes of the additional logic gate circuit being coupled to the output node of a corresponding one of the plurality of logic gate circuits, wherein the selection circuit includes a plurality of selection lines, each of the selection lines being coupled to the second input node of a corresponding one of the plurality of logic gate circuits, and the selection circuit being further configured to perform a toggle operation to supply the plurality of selection lines with the active level one by one; and wherein the additional logic gate circuit is configured to produce an output signal related to the first signal of one of the plurality of logic gate circuits that receives the active level at the second input node via an associated one of the plurality of selection lines, the additional logic gate circuit being further configured to provide the output signal to one of the plurality of terminals, and wherein the plurality of terminals includes a data strobe terminal, the data strobe terminal being used as the one of the plurality of terminals.

* * * * *